United States Patent
Yamamoto et al.

(10) Patent No.: US 10,539,733 B2
(45) Date of Patent: Jan. 21, 2020

(54) LIGHT-EMITTING UNIT, DISPLAY APPARATUS, AND LIGHTING APPARATUS

(71) Applicant: SONY CORPORATION, Tokyo (JP)

(72) Inventors: Takeshi Yamamoto, Tokyo (JP); Soya Araki, Kanagawa (JP); Tomoyuki Yoshimatsu, Kanagawa (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 16/077,315

(22) PCT Filed: Feb. 6, 2017

(86) PCT No.: PCT/JP2017/004220
§ 371 (c)(1),
(2) Date: Aug. 10, 2018

(87) PCT Pub. No.: WO2017/169123
PCT Pub. Date: Oct. 5, 2017

(65) Prior Publication Data
US 2019/0049651 A1    Feb. 14, 2019

(30) Foreign Application Priority Data
Mar. 31, 2016    (JP) .................................. 2016-070498

(51) Int. Cl.
*G02F 1/1335*    (2006.01)
*F21V 8/00*    (2006.01)

(52) U.S. Cl.
CPC ......... *G02B 6/0035* (2013.01); *G02B 6/0025* (2013.01); *G02B 6/0031* (2013.01);
(Continued)

(58) Field of Classification Search
CPC .. G02B 6/0035; G02B 6/0025; G02B 6/0031; G02B 6/0073; G02B 5/0231;
(Continued)

(56) References Cited

U.S. PATENT DOCUMENTS

2002/0080596 A1* 6/2002 Fukiharu .............. G02B 6/0038
362/601
2008/0037279 A1* 2/2008 Chan ................. G02F 1/133603
362/612

(Continued)

FOREIGN PATENT DOCUMENTS

CN    101114081 A    1/2008
CN    102003683 A    4/2011
(Continued)

OTHER PUBLICATIONS

International Search Report and Written Opinion of PCT Application No. PCT/JP2017/004220, dated Apr. 18, 2017, 09 pages of ISRWO.

Primary Examiner — Y. M. Lee
(74) *Attorney, Agent, or Firm* — Lerner, David, Littenberg, Krumholz & Mentlik, LLP (57) ABSTRACT

A light-emitting unit according to an embodiment of the present disclosure includes: a plurality of side-emission type light-emitting devices disposed two-dimensionally on a mounting surface; a light guide plate that is disposed at a position opposed to each of the light-emitting devices, and has uneven layers on a bottom surface and a top surface, the uneven layers controlling entry and exit of light; and a reflective structure that is fixed to at least the bottom surface out of the mounting surface and the bottom surface, and has a reflective section, the reflective section reflecting output light from each of the light-emitting devices toward the bottom surface.

9 Claims, 11 Drawing Sheets

(52) U.S. Cl.
CPC ......... *G02B 6/0068* (2013.01); *G02B 6/0073* (2013.01); *G02F 1/133602* (2013.01); *G02F 1/133603* (2013.01); *G02F 1/133605* (2013.01); *G02F 1/133606* (2013.01)

(58) Field of Classification Search
CPC .......... G02B 5/0278; F21S 2/00; F21V 5/008; F21V 5/005; F21V 5/045; F21V 13/14; F21V 7/0083; F21V 13/12; F21V 13/04; F21V 2200/20; G02F 2001/133607; G02F 1/133605; G02F 1/133606
See application file for complete search history.

(56) References Cited

U.S. PATENT DOCUMENTS

| | | | | |
|---|---|---|---|---|
| 2009/0027882 | A1* | 1/2009 | Kim | G02F 1/133603 |
| | | | | 362/234 |
| 2009/0129058 | A1 | 5/2009 | Tokita et al. | |
| 2010/0244058 | A1* | 9/2010 | Weng | G02B 5/0242 |
| | | | | 362/84 |
| 2011/0149594 | A1 | 6/2011 | Terajima et al. | |
| 2012/0026720 | A1* | 2/2012 | Cho | G02B 5/0242 |
| | | | | 362/84 |
| 2012/0275139 | A1* | 11/2012 | Chen | G02B 6/0025 |
| | | | | 362/97.2 |
| 2013/0021776 | A1* | 1/2013 | Veerasamy | F21V 7/0083 |
| | | | | 362/84 |
| 2016/0025904 | A1* | 1/2016 | Lee | G02B 5/0221 |
| | | | | 359/599 |
| 2017/0293055 | A1* | 10/2017 | Sun | G02B 6/004 |

FOREIGN PATENT DOCUMENTS

| | | |
|---|---|---|
| CN | 102102817 A | 6/2011 |
| EP | 1954982 A1 | 8/2008 |
| JP | 2003-115611 A | 4/2003 |
| JP | 2005-038776 A | 2/2005 |
| JP | 2007-287678 A | 11/2007 |
| JP | 2008-027916 A | 2/2008 |
| JP | 2011-211085 A | 10/2011 |
| KR | 10-2008-0009488 A | 1/2008 |
| KR | 10-1026898 B1 | 4/2011 |
| TW | 200732788 A | 9/2007 |
| WO | 2007/064002 A1 | 6/2007 |

\* cited by examiner

LIGHT-EMITTING UNIT, DISPLAY APPARATUS, AND LIGHTING APPARATUS

CROSS REFERENCE TO RELATED APPLICATIONS

This application is a U.S. National Phase of International Patent Application No. PCT/JP2017/004220 filed on Feb. 6, 2017, which claims priority benefit of Japanese Patent Application No. JP 2016-070498 filed in the Japan Patent Office on Mar. 31, 2016. Each of the above-referenced applications is hereby incorporated herein by reference in its entirety.

TECHNICAL FIELD

The present disclosure relates to a light-emitting unit, and to a display apparatus and a lighting apparatus that include such a light-emitting unit.

BACKGROUND ART

In recent years, a display apparatus such as a liquid crystal display apparatus has been making progress on reduction in thickness thereof with advances in technologies of a display panel and electronic components (for example, see PTL 1).

Citation List

Patent Literature

PTL 1: Japanese Unexamined Patent Application Publication No. 2005-38776

SUMMARY OF THE INVENTION

Meanwhile, as of late, it has been desired to further reduce the thickness without degrading in-plane uniformity of illumination light. It is desirable to provide a light-emitting unit that allows for further reduction in thickness without degrading in-plane uniformity of the illumination light, and a display apparatus and a lighting apparatus that include such a light-emitting unit.

A light-emitting unit according to an embodiment of the present disclosure includes: a plurality of side-emission type light-emitting devices disposed two-dimensionally on a mounting surface; a light guide plate that is disposed at a position opposed to each of the light-emitting devices, and has uneven layers on a bottom surface and a top surface, the uneven layers controlling entry and exit of light; and a reflective structure that is fixed to at least the bottom surface out of the mounting surface and the bottom surface, and has a reflective section, the reflective section reflecting output light from each of the light-emitting devices toward the bottom surface.

A display apparatus according to an embodiment of the present disclosure includes: a light-emitting unit that outputs illumination light; and a display panel that is disposed to be laid on the light-emitting unit, and displays an image with use of the illumination light. The light-emitting unit that is provided in the display apparatus has same component parts as those of the above-described light-emitting unit.

A lighting apparatus according to an embodiment of the present disclosure includes a light-emitting unit that outputs illumination light. The light-emitting unit that is provided in the lighting apparatus has same component parts as those of the above-described light-emitting unit.

In the light-emitting unit, the display apparatus, and the lighting apparatus according to the respective embodiments of the present disclosure, the plurality of side-emission type light-emitting devices are provided on the mounting surface, and output light from each of the light-emitting devices is reflected toward the bottom surface of the light guide plate by the reflective section of the reflective structure. This makes it possible to reduce a clearance between each of the light-emitting devices and the light guide plate that is necessitated to ensure in-plane uniformity of illumination light outputted from the light guide plate, as compared with a light-emitting unit provided with top-emission type light-emitting devices. Further, in the light-emitting unit, the display apparatus, and the lighting apparatus according to the respective embodiments of the present disclosure, the uneven layers that control entry and exit of light are provided on the bottom surface and the top surface of the light guide plate. Even if the clearance between each of the light-emitting devices and the light guide plate is narrow, this allows the uneven layers to ensure in-plane uniformity of the illumination light outputted from the light guide plate. Furthermore, in the light-emitting unit, the display apparatus, and the lighting apparatus according to the respective embodiments of the present disclosure, the reflective structure is fixed to at least the bottom surface of the light guide plate out of the mounting surface and the bottom surface of the light guide plate. This makes it possible to fix a positional relationship between the reflective structure and the uneven layers of the light guide plate, which makes it possible to provide a structure in accordance with the positional relationship with each of the light-emitting devices to the uneven layers, for example. As a result, it is possible to ensure in-plane uniformity of the illumination light outputted from the light guide plate by the uneven layers.

According to the light-emitting unit, the display apparatus, and the lighting apparatus of the respective embodiments of the present disclosure, the output light from the plurality of side-emission type light-emitting devices is reflected toward the bottom surface of the light guide plate by the reflective structure; in-plane uniformity of the illumination light is ensured by the uneven layers of the light guide plate; and further the positional relationship between the reflective structure and the uneven layers of the light guide plate is fixed, which allows for further reduction in thickness without degrading in-plane uniformity of the illumination light. It is to be noted that effects of the present disclosure are not necessarily limited to the effects described above, and may be any of effects described in the description.

MODES FOR CARRYING OUT THE INVENTION

Hereinafter, embodiments of the present disclosure are described in detail with reference to the drawings. It is to be noted that description is given in the following order.
1. First Embodiment (Light-Emitting Unit)
2. Second Embodiment (Display Apparatus)
3. Modification Examples of Light-Emitting Unit
4. Application Examples of Display Apparatus
5. Application Examples of Lighting Apparatus
<1. First Embodiment>
[Configuration of Light-Emitting Unit 1]

Figure 1:
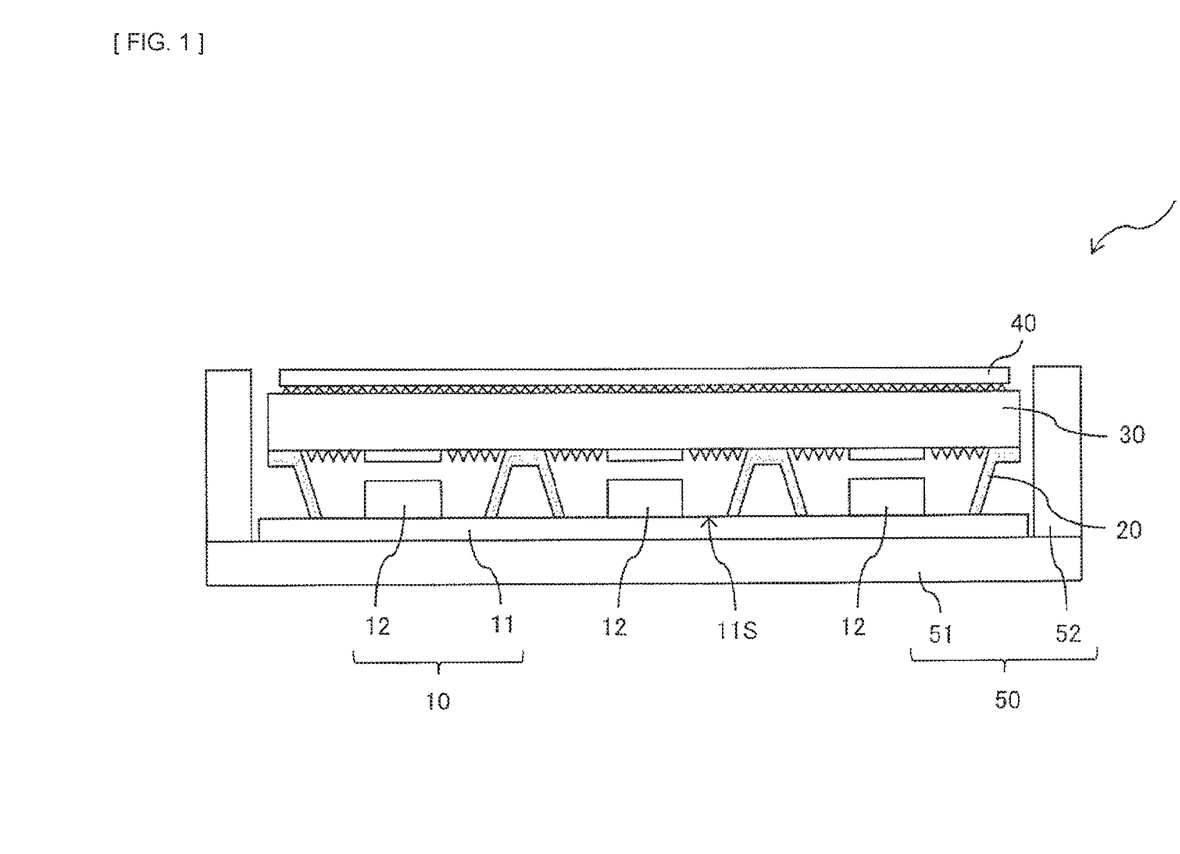
FIG. 1 is a cross-sectional view of an overall configuration example of a light-emitting unit according to a first embodiment of the present disclosure.
Figure 2:
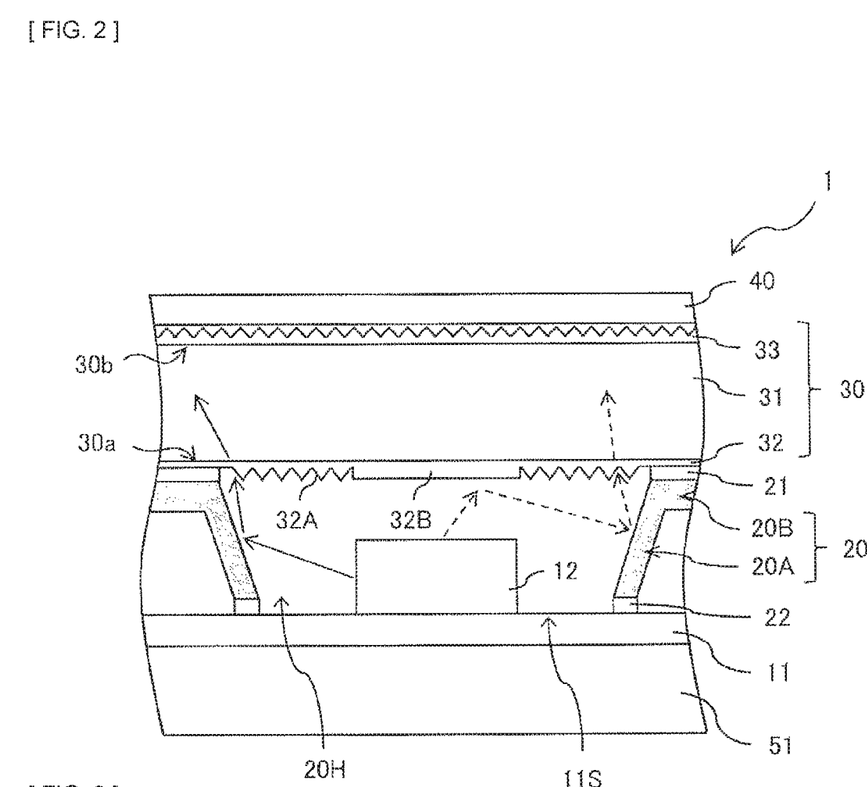
FIG. 2 is an enlarged cross-sectional view of a configuration example of a major part of the light-emitting unit illustrated in FIG. 1.

FIG. 1 is a cross-sectional view of an overall configuration example of a light-emitting unit 1 according to a first embodiment of the present disclosure. FIG. 2 is a cross-sectional view of an overall configuration example of the light-emitting unit 1. The light-emitting unit 1 is used, for example, as a backlight that illuminates a transmissive light modulation panel from behind, or as a lighting apparatus in a room or the like. The light-emitting unit 1 includes, for example, a mounting substrate 10, a reflective structure 20, a light guide plate 30, an optical sheet 40, and a chassis 50.

(Mounting Substrate 10)

The mounting substrate 10 has a wiring substrate 11 having a mounting surface 11S, and a plurality of side-emission type light-emitting devices 12 disposed two-dimensionally on the mounting surface 11S. The mounting substrate 10 further has, for example, a drive IC 13 (see FIG. 4 to be described later) that drives each of the light-emitting devices 12 on the mounting surface 11S. The drive IC 13 may be mounted on a wiring substrate that is different from the wiring substrate 11. The wiring substrate 11 is configured by providing a wiring layer on a film-like resin substrate, for example.

Figure 3:
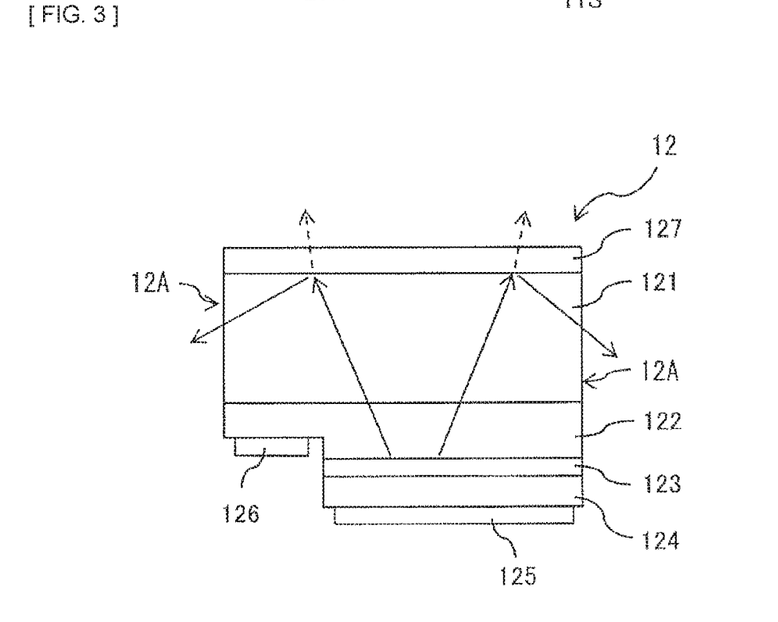
FIG. 3 is a cross-sectional view of a configuration example of a light-emitting device illustrated in FIG. 1.

FIG. 3 is a cross-sectional view of a configuration example of the light-emitting device 12. Each of the light-emitting devices 12 is, for example, a light-emitting diode having a flip-chip structure in which electrodes (a p-side electrode 125 and an n-side electrode 126 to be described later) are provided on a surface on a side on which the mounting surface 11S is located. Each of the light-emitting devices 12 is a face-down type light-emitting device, and has, for example, a semiconductor-laminated structure on a side on which a bottom surface is located of a light-transmissive substrate 121. The semiconductor-laminated structure is a structure in which, for example, an n-type semiconductor layer 122, an active layer 123, and a p-type semiconductor layer 124 are laminated in this order from a side on which the light-transmissive substrate 121 is located. In the semiconductor-laminated structure, a portion of the n-type semiconductor layer 122 is exposed, and the n-side electrode 126 is provided on an exposed surface of the n-type semiconductor layer 122. Further, the p-side electrode 125 is provided on a front surface of the p-type semiconductor layer 124. The light-transmissive substrate 121 includes, for example, a sapphire substrate, silicon carbide (SiC), etc. The n-type semiconductor layer 122 includes, for example, an n-type nitride semiconductor (for example, n-type GaN). The active layer 123 includes, for example, an n-type nitride semiconductor (for example, n-type GaN) having a quantum well structure. The p-type semiconductor layer 124 includes, for example, a p-type nitride semiconductor (for example, p-type GaN). The p-side electrode 125 and the n-side electrode 126 include, for example, a metallic material such as Al.

Figure 4:
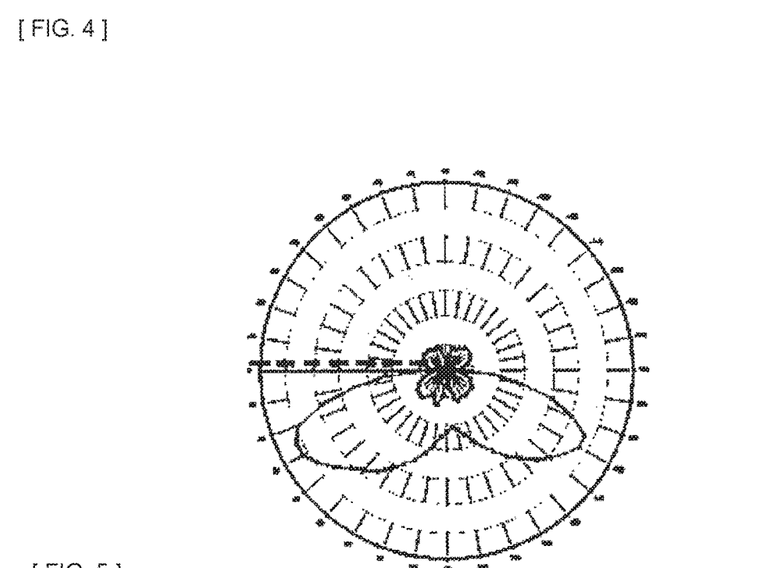
FIG. 4 is a diagram illustrating an example of light distribution characteristics of the light-emitting device illustrated in FIG. 3.

Each of the light-emitting devices 12 further has, for example, a reflection layer 127 on a surface on a side opposite to the mounting surface 11S (on a front surface of the light-transmissive substrate 121). The reflection layer 127 includes, for example, a silver-deposited film, an aluminum-deposited film, a multi-layer reflection film, etc. In each of the light-emitting devices 12, light emitted by the active layer 123 is reflected by the reflection layer 127, the p-side electrode 125, and the n-side electrode 126 to be outputted to the outside from a side surface 12A. Each of the light-emitting devices 12 has, for example, light distribution characteristics as illustrated in FIG. 4, and emits high-intensity light in a direction parallel to the mounting surface 11S rather than in a direction perpendicular to the mounting surface 11S. It is to be noted that, in each of the light-emitting devices 12, a portion of the light emitted by the active layer 123 leaks to the outside through the reflection layer 127. Further, each of the light-emitting devices 12 may include a material system other than material systems exemplified above. Each of the light-emitting devices 12 includes, for example, a bare chip that is not covered with a resin. A lens that includes a resin may be provided to cover a side surface and a top surface of each of the light-emitting devices 12.

(Reflective Structure 20)

The reflective structure 20 is disposed in a gap between the mounting surface 11S and the light guide plate 30 (a bottom surface 30a of the light guide plate 30). The reflective structure 20 is fixed to both the mounting surface 11S and the light guide plate 30 (the bottom surface 30a of the light guide plate 30). The reflective structure 20 has, for example, a reflective section 20A that reflects output light from each of the light-emitting devices 12 toward the light guide plate 30 (the bottom surface 30a of the light guide plate 30). The reflective structure 20 further has, for example, a portion (a flat section 20B) fixed to the light guide plate 30 (the bottom surface 30a of the light guide plate 30), in addition to the reflective section 20A. The reflective structure 20 has a trapezoid-based structure that includes the reflective section 20A and the flat section 20B. The reflective structure 20 is a hollow structure, in which the plurality of light-emitting devices 12 are disposed.

The flat section 20B is fixed to the light guide plate 30 (the bottom surface 30a of the light guide plate 30) with a bonding layer 21 in between. An end on a side on which the mounting substrate 10 is located of the reflective section 20A is fixed to the mounting substrate 10 (the mounting surface 11S) with the bonding layer 21 in between. Each of the bonding layers 21 and 22 includes, for example, an adhesive or a pressure-sensitive adhesive. A structure configured by the reflective section 20A and the flat section 20B is fixed to the mounting substrate 10 (the mounting surface 11S) and the light guide plate 30 (the bottom surface 30a of the light guide plate 30) with use of the bonding layers 21 and 22. As a result, a whole load to be applied to the structure configured by the reflective section 20A and the flat section 20B acts on nodes (portions in contact with the bonding layers 21 and 22 of the reflective structure 20), and a tensile stress and a compressive stress only act on the reflective structure 20. Therefore, the reflective structure 20 is configured to be resistant to deflection.

Figure 5:
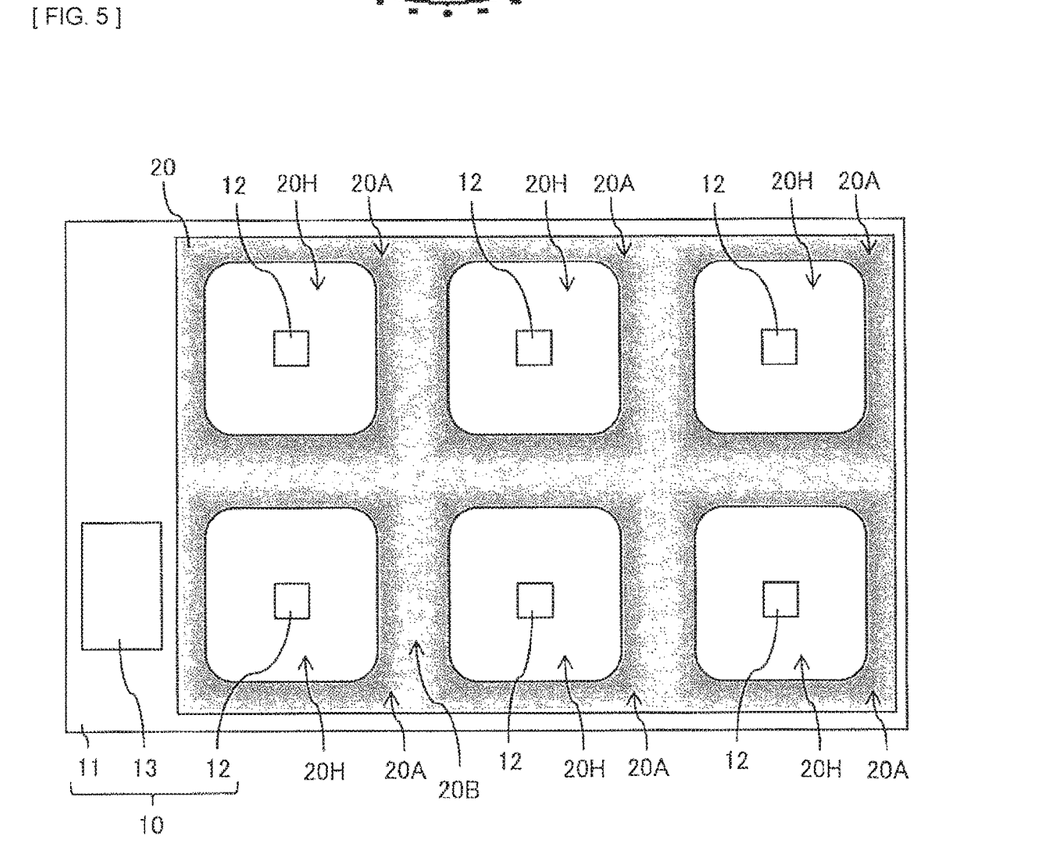
FIG. 5 is a plan view of a configuration example of a mounting substrate and a reflective structure illustrated in FIG. 1.

FIG. 5 illustrates an example of a planar configuration of the mounting substrate 10 and the reflective structure 20. The reflective structure 20 has a plurality of openings 20H surrounded by the reflective section 20A. One of the light-emitting devices 12 is disposed in each of the openings 20H. The mounting surface 11S is exposed in the openings 20H. In a case where the mounting surface 11S is covered with, for example, a white resist layer, the mounting surface 11S functions as a highly reflective surface. In a case where the plurality of openings 20H are disposed in a matrix pattern, a planar shape of the flat section 20B is in a grid pattern. The reflective structure 20 is, for example, a sheet-like resin molded body formed with a mold.

(Light Guide Plate 30)

The light guide plate 30 is disposed at a position opposed to each of the light-emitting devices 12. The light guide plate 30 has, for example, a plate-like light guide layer 31, and uneven layers 32 and 33 on the bottom surface 30a and a top surface 30b of the light guide plate 30. The uneven layers 32 and 33 control entry and exit of light. The light guide layer 31 includes, for example, a light-transmissive glass substrate or a light-transmissive resin substrate. The uneven layer 32 includes, for example, a film having unevenness that is fixed to a bottom surface of the light guide layer 31. The uneven layer 33 includes, for example, a film having unevenness that is fixed to a top surface of the light guide layer 31. The uneven layers 32 and 33 may be disposed on a front surface of a member configuring the light guide layer 31.

The uneven layer 32 has a refraction-transmission section 32A that is disposed at a position not opposed to each of the light-emitting devices 12 in a direction of a normal to the mounting substrate 10, and a diffusion-reflection section 32B that is disposed at a position opposed to each of the light-emitting devices 12 in the direction of the normal to the mounting substrate 10.

Figure 6:
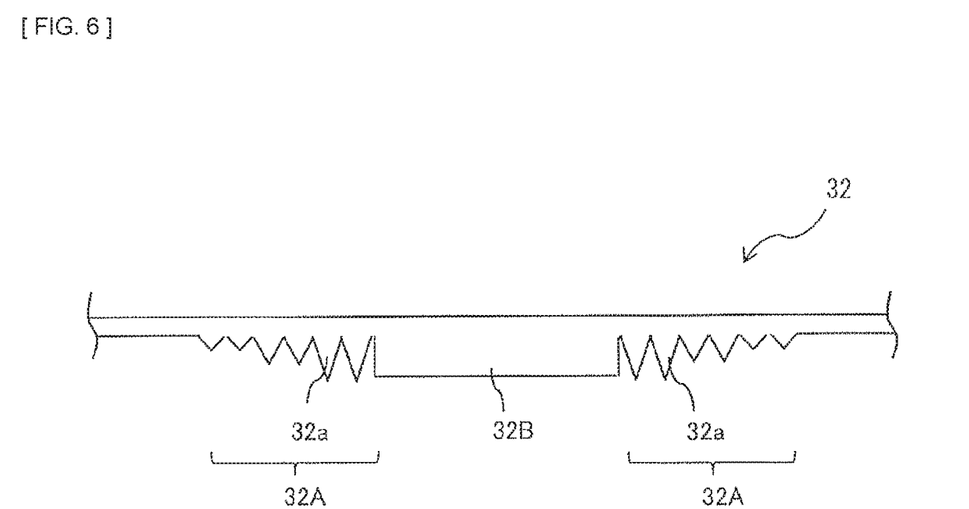
FIG. 6 is a cross-sectional view of a configuration example of an uneven layer on a bottom surface of a light guide plate illustrated in FIG. 1.
Figure 7:
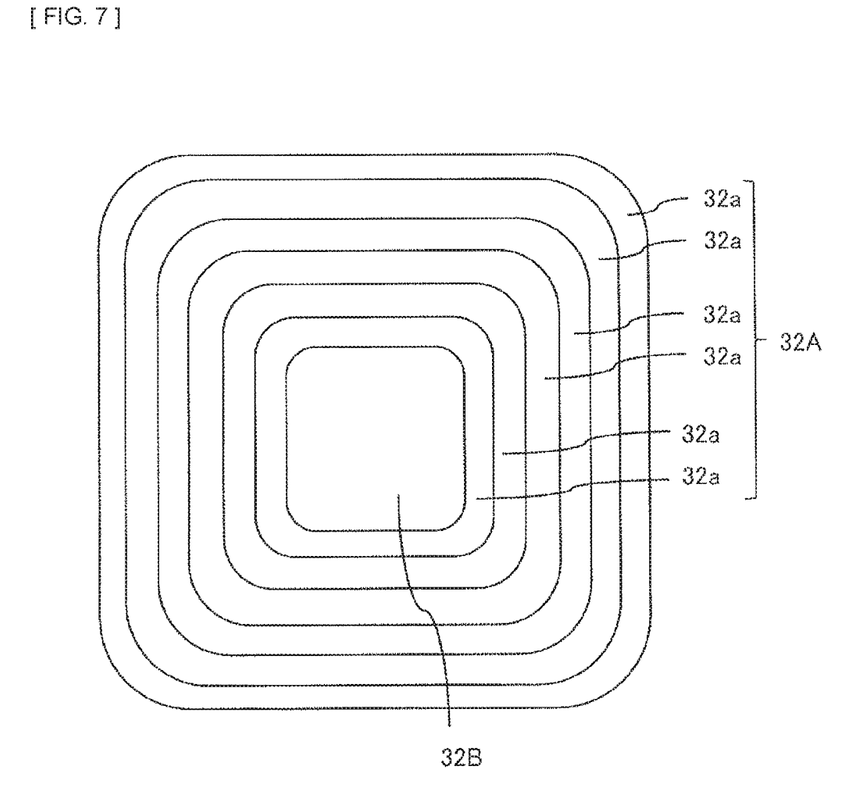
FIG. 7 is a plan view of a configuration example of the uneven layer illustrated in FIG. 6.

The refraction-transmission section 32A has a function of refracting and transmitting output light from each of the light-emitting devices 12 to cause such light to propagate through the inside of the light guide layer 31. For example, as illustrated in FIG. 6 and FIG. 7, the refraction-transmission section 32A includes a plurality of ring-like protrusions 32a disposed concentrically. FIG. 6 is a cross-sectional view of a configuration example of the refraction-transmission section 32A and the diffusion-reflection section 32B. FIG. 7 is a plan view of a configuration example of the refraction-transmission section 32A and the diffusion-reflection section 32B. The refraction-transmission section 32A is not limited to the configuration illustrated in each of FIG. 6 and FIG. 7.

The plurality of protrusions 32a each have, for example, a three-dimensional shape depending on a distance from the light-emitting device 12. The protrusion 32a closest to the light-emitting device 12 of the plurality of protrusions 32a is, for example, a triangular protrusion with a steep inclination angle, and reflects much of the output light from the light-emitting device 12. The protrusion 32a farthest from the light-emitting device 12 of the plurality of protrusions 32a is, for example, a triangular protrusion with a gentle inclination angle, and refracts and transmits much of the output light from the light-emitting device 12 to cause such light to propagate through the inside of the light guide layer 31. The protrusions 32a existing between the protrusion 32a closest to the light-emitting device 12 and the protrusion 32a farthest from the light-emitting device 12 of the plurality of protrusions 32a are triangular protrusions each having an inclination angle between the inclination angle of the protrusion 32a closest to the light-emitting device 12 and the inclination angle of the protrusion 32a farthest from the light-emitting device 12. These protrusions 32a partially reflect the output light from the light-emitting device 12, or partially refract and transmit the output light to propagate through the inside of the light guide layer 31.

The diffusion-reflection section 32B has a function of mainly diffusing and reflecting light outputted to the outside through the reflection layer 127 from each of the light-emitting devices 12, thereby preventing the output light from each of the light-emitting devices 12 from concentratedly entering a portion directly above each of the light-emitting devices 12 of the light guide layer 31. The diffusion-reflection section 32B includes, for example, a plurality of dot-shaped protrusions. For example, the diffusion-reflection section 32B may be configured by a section on which a scattering agent or a filler is printed in a pattern form, or may be configured by a section formed by partially roughening the bottom surface of the light guide layer 31.

The uneven layer 33 has a function of extracting light propagating through the inside of the light guide layer 31 to the outside. The uneven layer 33 is includes, for example, a plurality of dot-shaped protrusions. The uneven layer 33 is formed by printing a fine uneven pattern on the top surface of the light guide layer 31 using a nanoimprint technique, for example.

(Optical Sheet 40)

The optical sheet 40 is provided to face the top surface 30b of the light guide plate 30. The optical sheet 40 includes, for example, a diffusion plate, a diffusion sheet, a lens film, a polarization split sheet, etc. Providing such an optical sheet 40 allows light outputted from the light guide plate 30 in an oblique direction to rise toward a front direction, which makes it possible to enhance front luminance.

(Chassis 50)

The chassis 50 includes, for example, a back chassis 51 that is fixed to a rear surface of the mounting substrate 10, and a top chassis 52 that surrounds the mounting substrate 10, the reflective structure 20, the light guide plate 30, and the optical sheet 40. The back chassis 51 is a rear housing used to maintain flatness of the mounting surface 11S, and includes, for example, a metallic plate such as Fe or Al, a glass plate, a laminated plate, etc. The top chassis 52 is a frame-shaped member used to protect the mounting substrate 10, the reflective structure 20, the light guide plate 30, and the optical sheet 40 from the outside, and includes, for example, the same material as that of the back chassis 51.

[Effects]

Next, description is provided on effects of the light-emitting unit 1 according to the present embodiment. In the present embodiment, the plurality of side-emission type light-emitting devices 12 are provided on the mounting surface 11S, and the output light from each of the light-emitting devices 12 is reflected toward the bottom surface of the light guide plate 30 by the reflective section 20A of the reflective structure 20. This makes it possible to reduce a clearance between each of the light-emitting devices 12 and the light guide plate 30 that is necessitated to ensure in-plane uniformity of illumination light outputted from the light guide plate 30, as compared with a light-emitting unit provided with top-emission type light-emitting devices. Further, in the present embodiment, the uneven layers 32 and 33 that control entry and exit of light are provided on the bottom surface 30a and the top surface 30a of the light guide plate 30. Even if the clearance between each of the light-emitting devices 12 and the light guide plate 30 is narrow, this allows the uneven layers 32 and 33 to ensure in-plane uniformity of the illumination light outputted from the light guide plate 30. Furthermore, in the present embodiment, the reflective structure 20 is fixed to the light guide plate 30 (the bottom surface 30a of the light guide plate 30). This makes it possible to fix a positional relationship between the reflective structure 20 and the uneven layers 32 and 33 of the light guide plate 30, which makes it possible to provide a structure in accordance with the positional relationship with each of the light-emitting devices 12 to the uneven layer 32, for example. Besides, in the present embodiment, the reflective structure 20 is also fixed to the mounting surface 11S. This makes it possible to fix a positional relationship among each of the light-emitting devices 12, the reflective structure 20, and the uneven layers 32 and 33 of the light guide plate 30, which makes it possible to provide a structure in accordance with the positional relationship with each of the light-emitting devices 12 to the uneven layer 32, for example. As a result, it is possible to ensure in-plane uniformity of the illumination light outputted from the light guide plate 30 by the uneven layers 32 and 33. This allows for further reduction in thickness without degrading in-plane uniformity of the illumination light.

Further, in the present embodiment, the reflective structure 20 has a trapezoid-based structure that includes the reflective section 20A and the flat section 20B. Therefore, the reflective structure 20 is configured to be resistant to deflection, which allows the reflective structure 20 to maintain a clearance between each of the light-emitting devices 12 and the light guide plate 30. This makes it hard to vary the clearance between each of the light-emitting devices 12 and the light guide plate 30 due to deflection of the light-emitting unit 1, which allows for further reduction in thickness without degrading in-plane uniformity of the illumination light.

Furthermore, in the present embodiment, the reflective structure 20 has the plurality of openings 20H surrounded by the reflective section 20A, and one of the light-emitting devices 12 is disposed in each of the openings 20H. This prevents the clearance between each of the light-emitting devices 12 and the light guide plate 30 from being merely a dead space, and the clearance takes up part of reinforcement in the reflective structure 20. As a result, this makes it possible to minimize a space for a structure for reinforcement of the light-emitting unit 1, which allows for further reduction in thickness.

Besides, in the present embodiment, each of the light-emitting devices 12 is the light-emitting diode having the flip-chip structure in which the electrodes (the p-side electrode 125 and the n-side electrode 126) are provided on the surface on the side on which the mounting surface 11S is located. This makes it possible to reduce the clearance between each of the light-emitting devices 12 and the light guide plate 30, as compared with a case where in each of the light-emitting devices 12 is electrically coupled through wire bonding, or a lens is provided on each of the light-emitting devices 12. As a result, this allows for further reduction in thickness.

Further, in the present embodiment, the uneven layer 32 that is provided on the above-described bottom surface of the light guide plate has the refraction-transmission section 32A at the position not opposed to each of the light-emitting devices 12, and has the diffusion-reflection section 32B at the position opposed to each of the light-emitting devices 12. For example, this makes it possible to prevent the output light from each of the light-emitting devices 12 from concentratedly entering a portion directly above each of the light-emitting devices 12 of the light guide layer 31, and to efficiently introduce the output light from each of the light-emitting devices 12 into the light guide layer 31. Moreover, for example, it is possible to extract, to the outside, the light propagating through the inside of the light guide layer 31 as illumination light with superior in-plane uniformity. This allows for an improvement in in-plane uniformity of the illumination light.

<2. Second Embodiment>

Figure 8:
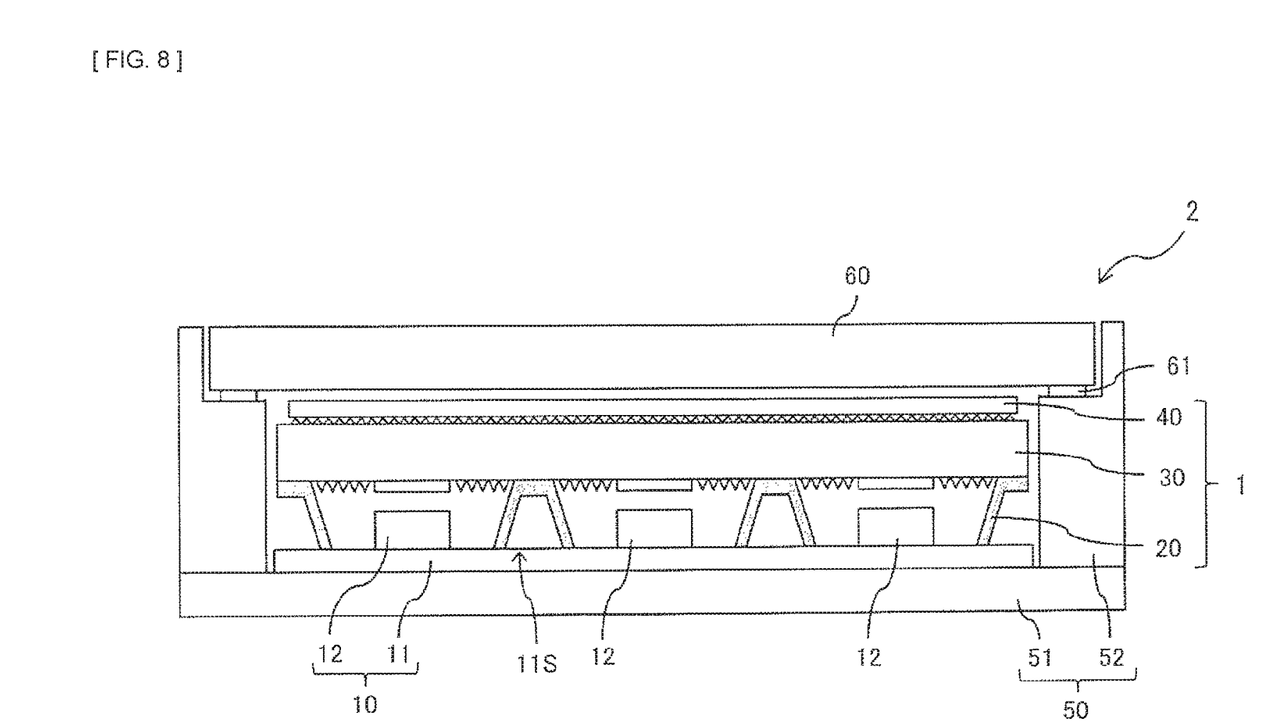
FIG. 8 is a cross-sectional view of an overall configuration example of a display apparatus according to a second embodiment of the present disclosure.

FIG. 8 is a cross-sectional view of an overall configuration example of a display apparatus 2 according to a second embodiment of the present disclosure. The display apparatus 2 includes the light-emitting unit 1, and is used as a flat-screen television apparatus, for example. The display apparatus 2 includes the light-emitting unit 1 a display panel 60. The light-emitting unit 1 outputs illumination light. The display panel 60 is disposed to be laid on the light-emitting unit 1, and displays an image with use of the illumination light. The display panel 60 is fixed to a pedestal section provided in the top chassis 52 with a bonding layer 61 in between. In the present embodiment, the light-emitting unit 1 is used as a backlight. This allows for further reduction in thickness without degrading in-plane uniformity of the illumination light.

<3. Modification Examples of Light-Emitting Unit>

Hereinafter, description is provided on modification examples of the light-emitting unit 1. It is to be noted that same component parts as those in the above-described embodiments are hereinafter denoted by same reference numerals as those denoted in the above-described embodiments. Further, description is mainly provided on component parts that differ from those in the above-described embodiments, and description of same component parts as those in the above-described embodiments is omitted as appropriate.

[Modification Example A]

Figure 9:
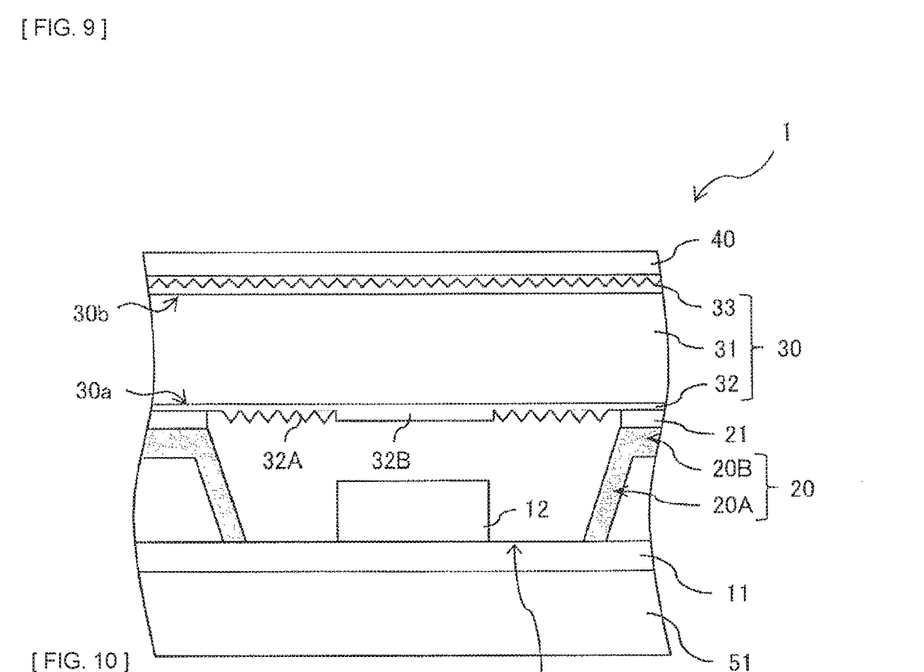
FIG. 9 is an enlarged cross-sectional view of a configuration example of a major part of the light-emitting unit illustrated in FIG. 1 and FIG. 8.

In the light-emitting unit 1 according to the above-described embodiment, the reflective structure 20 is fixed to both of the light guide plate 30 (the bottom surface 30a of the light guide plate 30) and the mounting surface 11S. However, for example, as illustrated in FIG. 9, the reflective structure 20 may be fixed only to the light guide plate 30 (the bottom surface 30a of the light guide plate 30). At this time, the reflective structure 20 is fixed to the light guide plate 30 (the bottom surface 30a of the light guide plate 30) with the bonding layer 21 in between, for example. Even in such a case, it is possible to reinforce the light-emitting unit 1 by the reflective structure 20, which allows for further reduction in thickness without degrading in-plane uniformity of the illumination light.

[Modification Example B]

Figure 10:
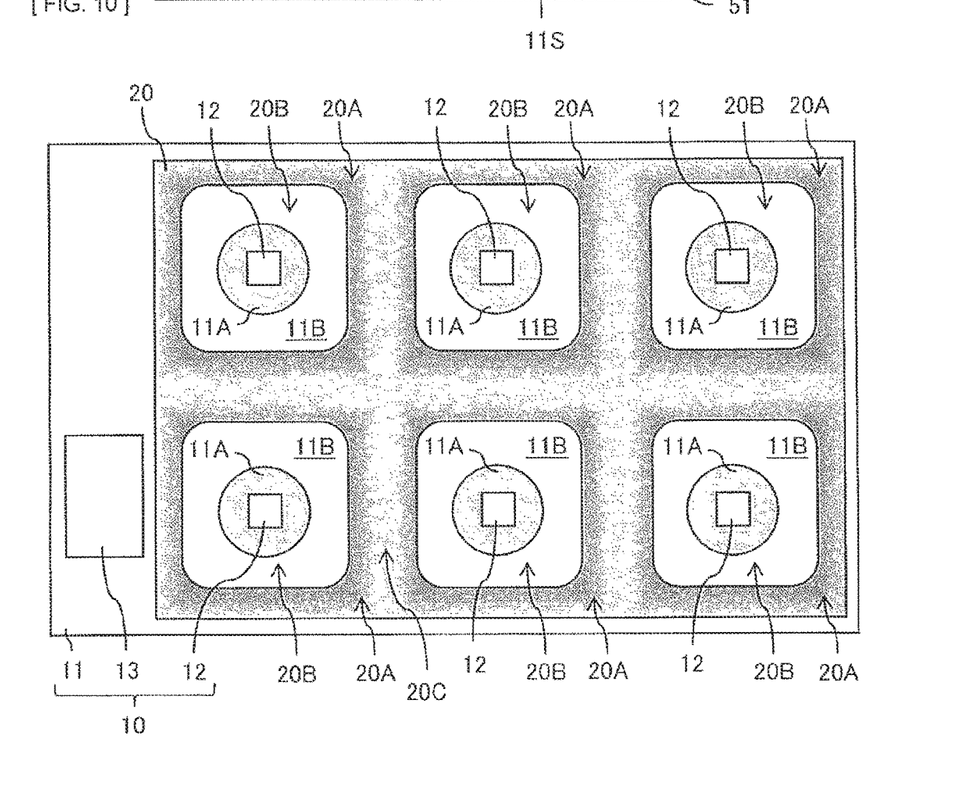
FIG. 10 is a plan view of a configuration example of a mounting substrate and a reflective structure illustrated in FIG. 1 and FIG. 8.

In the light-emitting unit 1 according to the above-described embodiment, for example, as illustrated in FIG. 10, the wiring substrate 11 may have low-reflective surfaces 11A (first reflective surfaces) having relatively low reflectance on peripheries of the respective light-emitting devices 12 in the mounting surface 11S, and high-reflective surfaces 11B (second reflective surfaces) having relatively high reflectance on peripheries of the respective low-reflective surfaces 11A in the mounting surface 11S. The low-reflective surface 11A includes, for example, a metallic surface in a wiring layer of the wiring substrate 11. The wiring layer is the same as a wiring layer in which an electrode pad electrically coupled to the electrodes (the p-side electrode 125 and the n-side electrode 126) of each of the light-emitting devices 12 is formed. The high-reflective surface 11B includes, for example, a surface of a white resist layer covering the front surface of the mounting substrate 10. This makes it possible to prevent the output light from each of the light-emitting devices 12 from being reflected by the white resist layer covering the front surface of the mounting substrate 10 to be concentrated on a portion directly above each of the light-emitting devices 12 of the bottom surface 30a of the light guide plate 30. Here, the low-reflective surface 11A and the high-reflective surface 11B are not new structures that are separately provided; therefore, there is no possibility that the light-emitting unit 1 is thickened by provision of the low-reflective surface 11A and the high-reflective surface 11B. Therefore, it is possible to achieve further reduction in thickness without degrading in-plane uniformity of the illumination light.

[Modification Example C]

Figure 11:
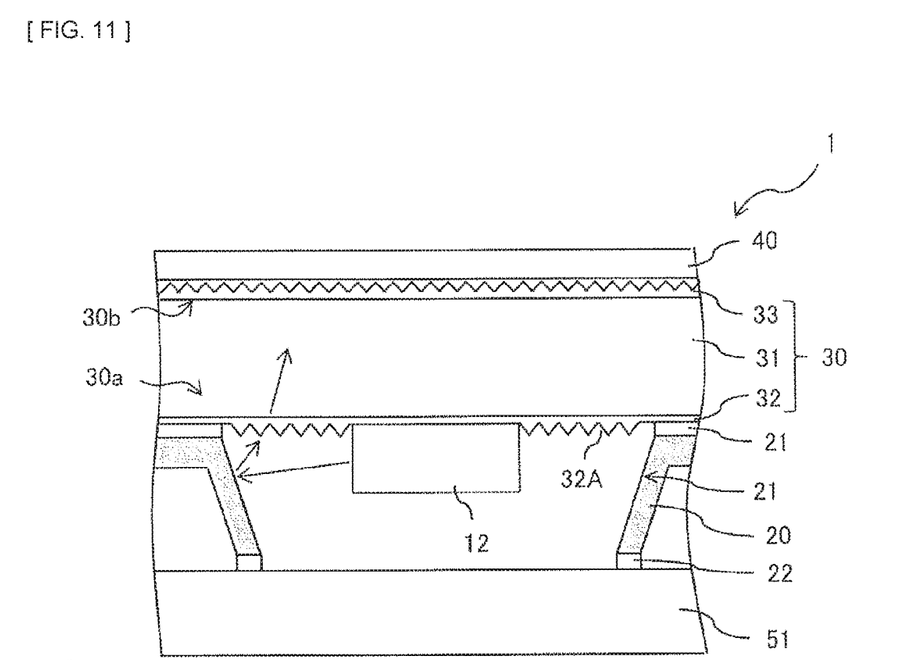
FIG. 11 is an enlarged cross-sectional view of a configuration example of the major part of the light-emitting unit illustrated in FIG. 1 and FIG. 8.

In the light-emitting unit 1 according to the above-described embodiment, the uneven layer 32 may double as the mounting substrate 10. For example, as illustrated in FIG. 11, in the uneven layer 32, the diffusion-reflection sections 32B are omitted, and one of the light-emitting devices 12 is provided at each of positions where the diffusion-reflection sections 32B are provided. In such a case, a clearance between each of the light-emitting devices 12 and the light guide plate 30 becomes slightly greater, as compared with the above-described embodiment. However, it is possible to achieve further reduction in thickness without degrading in-plane uniformity of the illumination light, as compared with currently-available approaches.

[Modification Example D]

Figure 12:
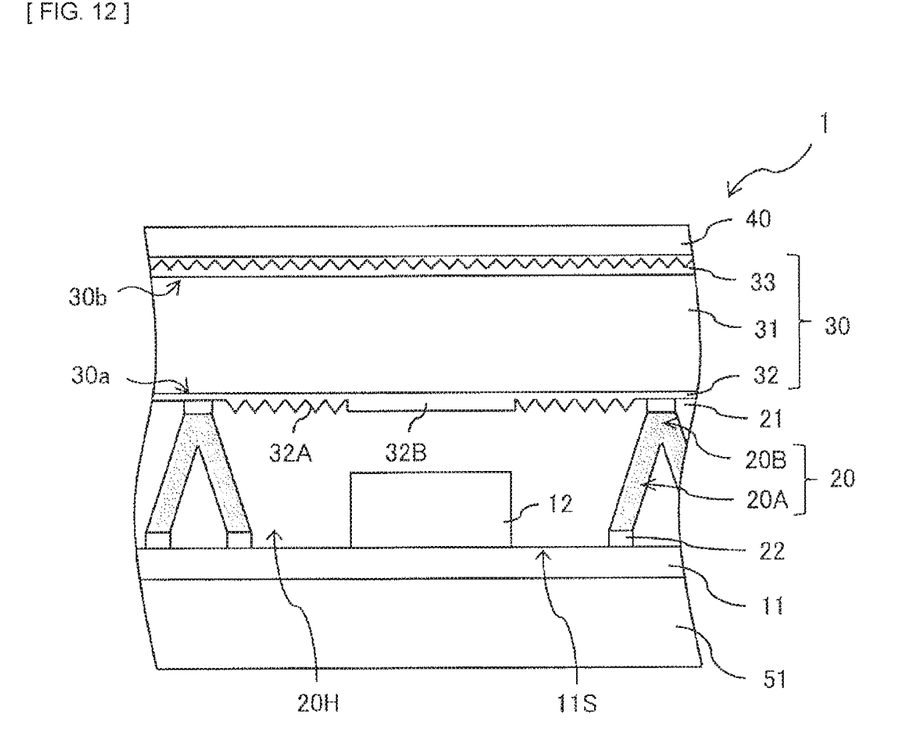
FIG. 12 is an enlarged cross-sectional view of a configuration example of the major part of the light-emitting unit illustrated in FIG. 1 and FIG. 8.

In the light-emitting unit 1 according to the above-described embodiment, for example, as illustrated in FIG. 12, the reflective structure 20 may be configured as a triangle-based structure by the reflective section 20A and the flat section 20B. Even in such a case, it is possible to achieve further reduction in thickness without degrading in-plane uniformity of the illumination light, as with the above-described embodiment.

[Modification Example E]

Figure 13:
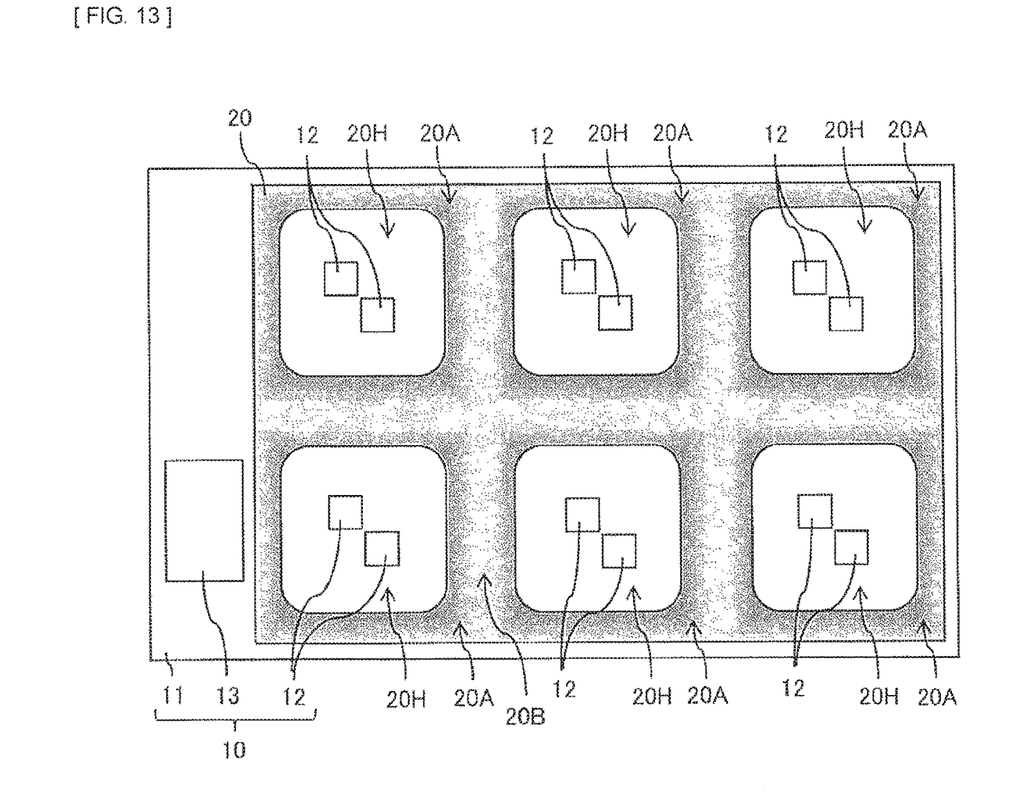
FIG. 13 is a plan view of a configuration example of the mounting substrate and the reflective structure illustrated in FIG. 1 and FIG. 8.

In the light-emitting unit 1 according to the above-described embodiment, for example, as illustrated in FIG. 13, a plurality of (for example, two) light-emitting devices 12 may be disposed in each of the openings 20H. Even in such a case, it is possible to achieve further reduction in thickness without degrading in-plane uniformity of the illumination light, as with the above-described embodiment.

[Modification Example F]

Figure 14:
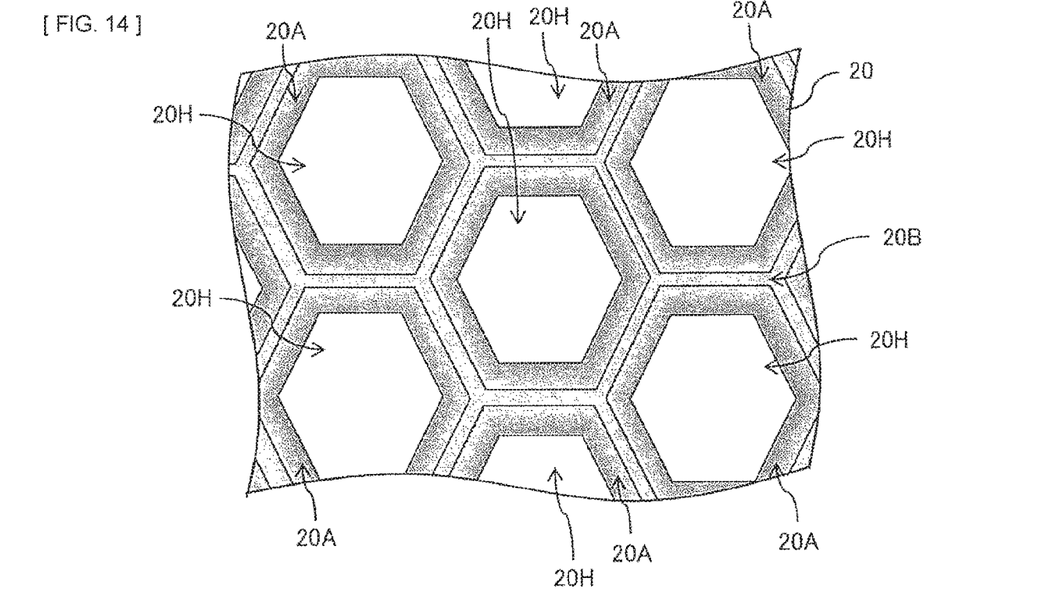
FIG. 14 is a plan view of a configuration example of the reflective structure illustrated in FIG. 1 and FIG. 8.

In the light-emitting unit 1 according to the above-described embodiment, for example, as illustrated in FIG. 14, the reflective structure 20 may be a honeycomb structure. Even in such a case, it is possible to achieve further reduction in thickness without degrading in-plane uniformity of the illumination light, as with the above-described embodiment.

<4. Application Examples of Display Apparatus>

Hereinafter, description is provided on application examples of the display apparatus 2 to electronic apparatuses. Examples of the electronic apparatuses include a television apparatus, a digital camera, a notebook personal computer, a mobile terminal apparatus such as a mobile phone, a video camera, etc. In other words, the display apparatus 2 is applicable to electronic apparatuses in every field that display externally inputted image signals or internally generated image signals as images or video pictures.

Figure 15:
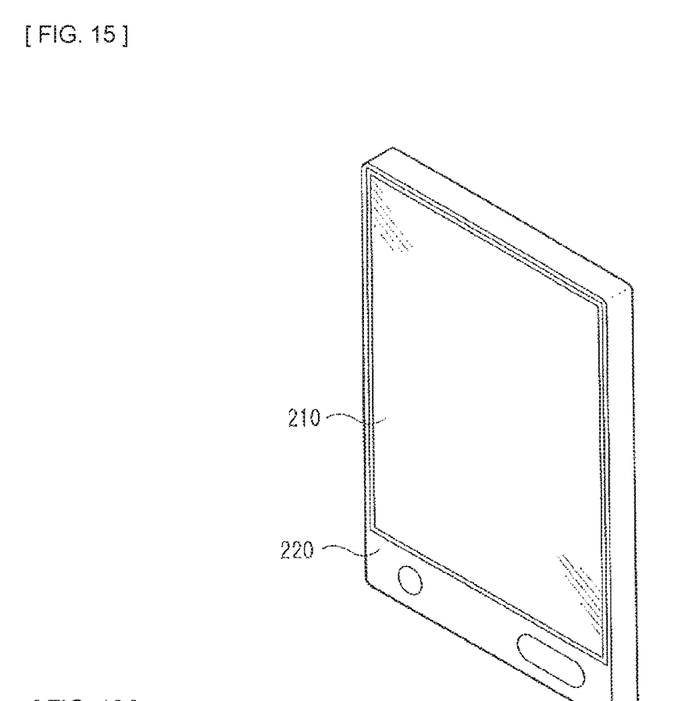
FIG. 15 is a perspective view of an external appearance of a tablet terminal apparatus (an application example 1) mounted with a display apparatus of the present disclosure.
Figure 16:
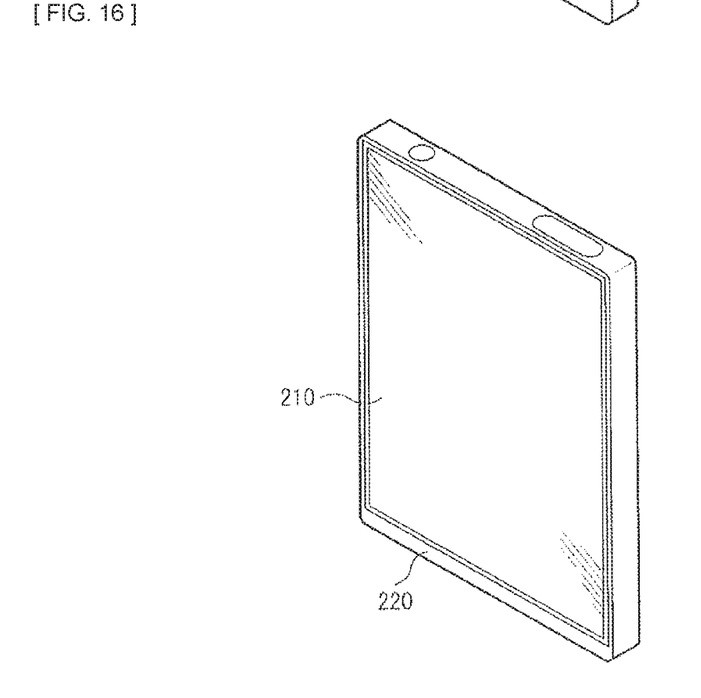
FIG. 16 is a perspective view of an external appearance of another tablet terminal apparatus (the application example 1) mounted with the display apparatus of the present disclosure.

FIG. 15 illustrates an external appearance of a tablet terminal apparatus to which the display apparatus 2 is applicable. FIG. 16 illustrates an external appearance of another tablet terminal apparatus to which the display apparatus 2 is applicable. Any of these tablet terminal apparatuses has, for example, a display section 210 and a non-display section 220, and the display section 210 is configured by the display apparatus 2.

<5. Application Examples of Lighting Apparatus>

Figure 17:
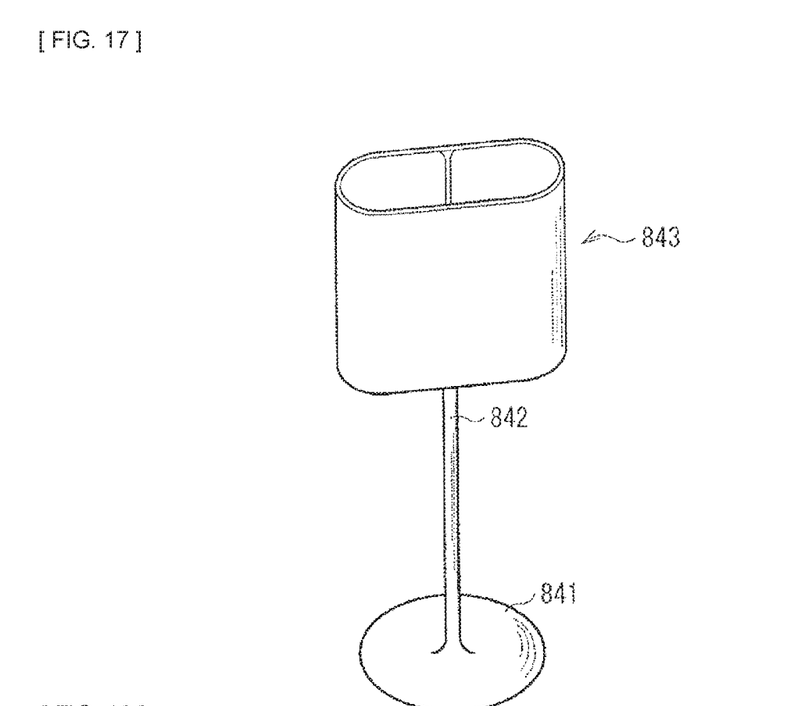
FIG. 17 is a perspective view of an external appearance of a first lighting apparatus that includes a light-emitting unit of the present disclosure.
Figure 18:
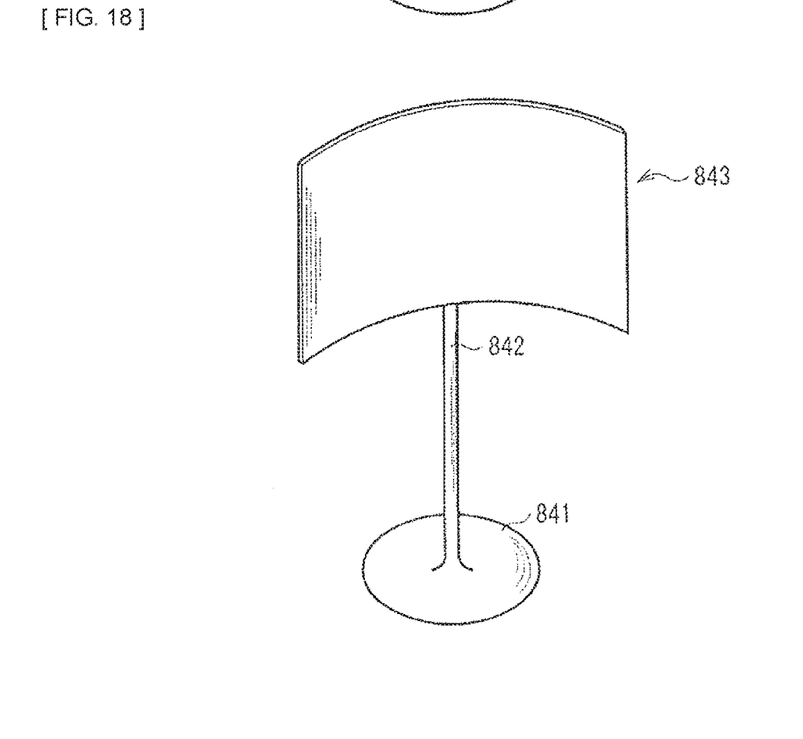
FIG. 18 is a perspective view of an external appearance of a second lighting apparatus that includes the light-emitting unit of the present disclosure.

Each of FIGS. 17 and 18 illustrates an external appearance of a tabletop or floor-standing lighting apparatus to which the light-emitting unit 1 is applicable. Any of these lighting apparatuses includes, for example, a lighting section 843 attached to a support post 842 that is provided on a base 841. The lighting section 843 includes the light-emitting unit 1. It is possible for the lighting section 843 to take any shape such as a tubular shape illustrated in FIG. 17, or a curved surface shape illustrated in FIG. 18 by configuring the light guide plate 30 in a curved shape.

Figure 19:
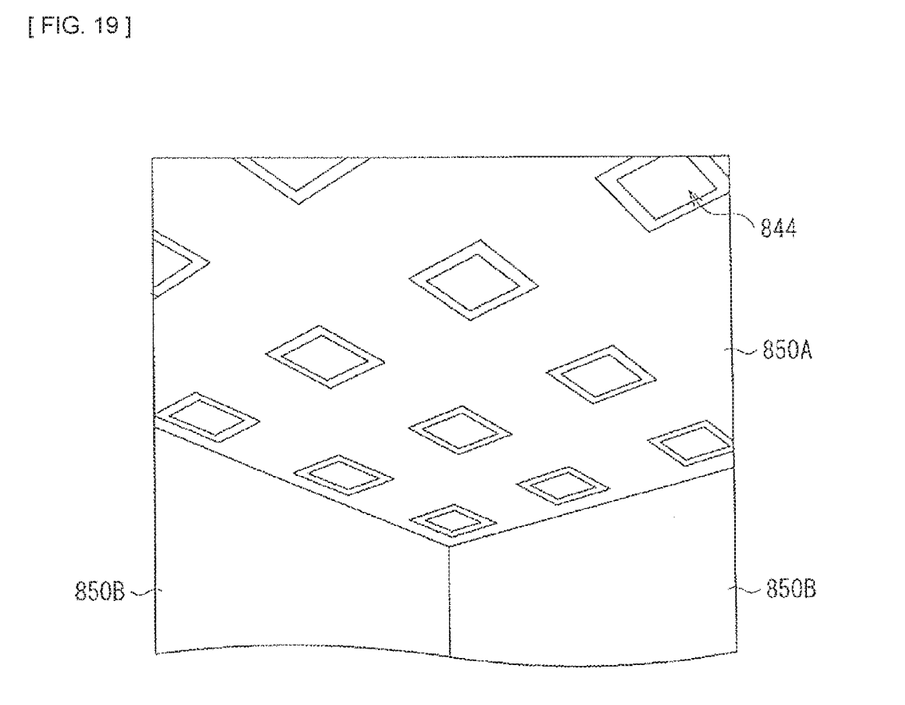
FIG. 19 is a perspective view of an external appearance of a third lighting apparatus that includes the light-emitting unit of the present disclosure.

FIG. 19 illustrates an external appearance of an indoor lighting apparatus to which the light-emitting unit 1 is applicable. The lighting apparatus has a lighting section 844 that is configured by the light-emitting unit 1, for example. The appropriate number of the lighting sections 844 is disposed at appropriate spacing intervals on a ceiling 850A of a building. It is to be noted that the lighting section 844 may be installed not only on the ceiling 850A, but also on any other locations such as a wall 850B or a floor (not illustrated) depending on the intended use.

In these lighting apparatuses, illumination is performed through the light from the light-emitting unit 1. This makes it possible to achieve a thin lighting apparatus having superior in-plane uniformity of the illumination light.

The present disclosure has been described heretofore with reference to the embodiments and modification examples thereof, and the application examples; however, the present disclosure is not limited to the above-described embodiments, etc., and may be modified in a variety of ways. It is to be noted that the effects described in the description are merely exemplified. The effects of the present disclosure are not limited to the effects described in the description. The present disclosure may have any effects other than the effects described in the description.

Further, for example, the present disclosure may have the following configurations.

(1)

A light-emitting unit, including:

a plurality of side-emission type light-emitting devices disposed two-dimensionally on a mounting surface;

a light guide plate that is disposed at a position opposed to each of the light-emitting devices, and has uneven layers on a bottom surface and a top surface, the uneven layers controlling entry and exit of light; and a reflective structure that is fixed to at least the bottom surface out of the mounting surface and the bottom surface, and has a reflective section, the reflective section reflecting output light from each of the light-emitting devices toward the bottom surface.

(2)

The light-emitting unit according to (1), in which the reflective structure has a triangle- or trapezoid-based structure that is configured by the reflective section and a portion fixed to the bottom surface.

(3)

The light-emitting unit according to (1) or (2), further including a wiring substrate having the mounting surface, in which the reflective structure is disposed in a gap between the mounting surface and the bottom surface, and is fixed to both the mounting surface and the bottom surface.

(4)

The light-emitting unit according to any one of (1) to (3), in which the reflective structure has a plurality of openings surrounded by the reflective section, and one, or two or more of the light-emitting devices are disposed in each of the openings.

(5)

The light-emitting unit according to any one of (1) to (4), in which each of the light-emitting devices is a light-emitting diode having a flip-chip structure in which electrodes are provided on a surface on a side on which the mounting surface is located.

(6)

The light-emitting unit according to any one of (1) to (5), in which the uneven layer that is provided on the bottom surface of the light guide plate has a refraction-transmission section at a position not opposed to each of the light-emitting devices, and has a diffusion-reflection section at a position opposed to each of the light-emitting devices.

(7)

The light-emitting unit according to (3), in which the wiring substrate has first reflective surfaces on peripheries of the respective light-emitting devices and second reflective surfaces on peripheries of the respective first reflective surfaces in the mounting surface, the first reflective surfaces having relatively low reflectance, and the second reflective surfaces having relatively high reflectance.

(8)

A display apparatus provided with a light-emitting unit that outputs illumination light and a display panel that is disposed to be laid on the light-emitting unit and displays an image with use of the illumination light, the light-emitting unit including:

a plurality of side-emission type light-emitting devices disposed two-dimensionally on a mounting surface;

a light guide plate that is disposed at a position opposed to each of the light-emitting devices, and has uneven layers on a bottom surface and a top surface, the uneven layers controlling entry and exit of light; and a reflective structure that is fixed to at least the bottom surface out of the mounting surface and the bottom surface, and has a reflective section, the reflective section reflecting output light from each of the light-emitting devices toward the bottom surface.

(9)

A lighting apparatus provided with a light-emitting unit that outputs illumination light, the light-emitting unit including:

a plurality of side-emission type light-emitting devices disposed two-dimensionally on a mounting surface;

a light guide plate that is disposed at a position opposed to each of the light-emitting devices, and has uneven layers on a bottom surface and a top surface, the uneven layers controlling entry and exit of light; and a reflective structure that is fixed to at least the bottom surface out of the mounting surface and the bottom surface, and has a reflective section, the reflective section reflecting output light from each of the light-emitting devices toward the bottom surface.

This application claims the benefit of Japanese Priority Patent Application No. 2016-070498 filed with the Japan Patent Office on Mar. 31, 2016, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A light-emitting unit, comprising:
a plurality of side-emission type light-emitting devices on a mounting surface;
a light guide plate at a first position opposed to each of the plurality of side-emission type light-emitting devices, wherein
  the light guide plate comprises:
    a bottom surface,
    a top surface, and
    uneven layers on the bottom surface and the top surface,
  the uneven layers are configured to control an entry of light into the light guide plate and an exit of the light from the light guide plate,
  an uneven layer of the uneven layers comprises a plurality of protrusions, and
  the plurality of protrusions is concentric; and
a reflective structure fixed to at least one of the mounting surface or the bottom surface,
  wherein the reflective structure comprises a reflective section configured to reflect output light from each of the plurality of side-emission type light-emitting devices toward the bottom surface.

2. The light-emitting unit according to claim 1, wherein the reflective structure has one of a triangle-based structure or a trapezoid-based structure, and
the reflective structure further comprises a portion fixed to the bottom surface of the light guide plate.

3. The light-emitting unit according to claim 2, further comprising a wiring substrate having the mounting surface, wherein the reflective structure is in a gap between the mounting surface and the bottom surface of the light guide plate.

4. The light-emitting unit according to claim 3, wherein
the reflective structure further comprises a plurality of openings surrounded by the reflective section, and
at least one side-emission type light-emitting device of the plurality of side-emission type light-emitting devices is in each of the plurality of openings.

5. The light-emitting unit according to claim 3, wherein the wiring substrate comprises:
a first reflective surface on a periphery of each of the plurality of side-emission type light-emitting devices; and
a second reflective surface on a periphery of the first reflective surface, and
the first reflective surface has a low reflectance than the second reflective surface.

6. The light-emitting unit according to claim 1, wherein
each of the plurality of side-emission type light-emitting devices is a light-emitting diode,
the light-emitting diode has a flip-chip structure, and
the flip-chip structure includes electrodes on a surface of the flip-chip structure on a side on which the mounting surface is located.

7. The light-emitting unit according to claim 1, wherein
the uneven layer on the bottom surface of the light guide plate includes:
a refraction-transmission section at a second position unopposed to each of the plurality of side-emission type light-emitting devices, and
a diffusion-reflection section at a third position opposed to each of the plurality of side-emission type light-emitting devices.

8. A display apparatus comprising:
a light-emitting unit configured to output illumination light; and
a display panel configured to display an image based on the illumination light, wherein
the display panel is on the light-emitting unit, and
the light-emitting unit comprises:
a plurality of side-emission type light-emitting devices on a mounting surface;
a light guide plate at a position opposed to each of the plurality of side-emission type light-emitting devices, wherein
the light guide plate comprises:
a bottom surface,
a top surface, and
uneven layers on the bottom surface and the top surface,
the uneven layers are configured to control an entry of light into the light guide plate and an exit of the light from the light guide plate,
an uneven layer of the uneven layers comprises a plurality of protrusions, and
the plurality of protrusions is concentric; and
a reflective structure fixed to at least one of the mounting surface or the bottom surface,
wherein the reflective structure comprises a reflective section configured to reflect output light from each of the plurality of side-emission type light-emitting devices toward the bottom surface.

9. A lighting apparatus comprising:
a light-emitting unit configured to output illumination light, wherein the light-emitting unit comprises:
a plurality of side-emission type light-emitting devices on a mounting surface;
a light guide plate at a position opposed to each of the plurality of side-emission type light-emitting devices, wherein
the light guide plate comprises:
a bottom surface,
a top surface, and
uneven layers on the bottom surface and the top surface,
the uneven layers are configured to control an entry of light into the light guide plate and an exit of the light from the light guide plate,
an uneven layer of the uneven layers comprises a plurality of protrusions, and
the plurality of protrusions is concentric; and
a reflective structure fixed to at least one of the mounting surface or the bottom surface,
wherein the reflective structure comprises a reflective section configured to reflect output light from each of the plurality of side-emission type light-emitting devices toward the bottom surface.

* * * * *